United States Patent
Bauer

(10) Patent No.: US 7,852,671 B2
(45) Date of Patent: Dec. 14, 2010

(54) DATA PATH FOR MULTI-LEVEL CELL MEMORY, METHODS FOR STORING AND METHODS FOR UTILIZING A MEMORY ARRAY

(75) Inventor: Mark Bauer, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 85 days.

(21) Appl. No.: 12/261,928

(22) Filed: Oct. 30, 2008

(65) Prior Publication Data

US 2010/0110788 A1 May 6, 2010

(51) Int. Cl.
G11C 11/34 (2006.01)
(52) U.S. Cl. .............................. 365/185.03; 365/185.24
(58) Field of Classification Search ............ 365/185.03, 365/185.24
See application file for complete search history.

(56) References Cited

U.S. PATENT DOCUMENTS

| | | | |
|---|---|---|---|
| 5,473,577 A * | 12/1995 | Miyake et al. ............... 365/238 |
| 5,771,248 A * | 6/1998 | Katayama et al. ............ 714/763 |
| 6,483,742 B1 | 11/2002 | Sweha et al. ............ 365/185.03 |
| 6,512,525 B1 * | 1/2003 | Capps et al. ................ 715/762 |
| 6,532,556 B1 | 3/2003 | Wong et al. .................. 714/702 |
| 7,278,723 B2 * | 10/2007 | Silverbrook .................. 347/86 |
| 2003/0081693 A1 * | 5/2003 | Raghavan et al. ............ 375/298 |
| 2007/0171714 A1 | 7/2007 | Wu et al. ................ 365/185.09 |
| 2007/0195597 A1 | 8/2007 | Park et al. .............. 365/185.03 |

* cited by examiner

Primary Examiner—Michael T Tran
(74) Attorney, Agent, or Firm—Dorsey & Whitney LLP

(57) ABSTRACT

Memories, data paths, methods for storing, and methods for utilizing are disclosed, including a data path for a memory using multi-level memory cells to provide storage of multiple bits per memory cell. One such data path includes a bit mapping circuit and a data converter circuit. Such a bit mapping circuit can be configured to map bits of the original data to an intermediate arrangement of bits and such a data converter circuit can be configured to receive the intermediate arrangement of bits and convert the intermediate arrangement of bits into intermediate data corresponding to a memory state to be stored by memory cells of a memory cell array.

29 Claims, 8 Drawing Sheets

Fig. 3

| USER DATA | | | | | STATE MAP | |
|---|---|---|---|---|---|---|
| B4 | B3 | B2 | B1 | B0 | CELL 0 | CELL 1 |
| 1 | 1 | 1 | 1 | 1 | L0 | L0 |
| 1 | 1 | 1 | 1 | 0 | L0 | L1 |
| 1 | 1 | 1 | 0 | 1 | L0 | L2 |
| 1 | 1 | 1 | 0 | 0 | L0 | L3 |
| 1 | 1 | 0 | 1 | 1 | L0 | L4 |
| 1 | 1 | 0 | 1 | 0 | L0 | L5 |
| 1 | 1 | 0 | 0 | 1 | L1 | L0 |
| 1 | 1 | 0 | 0 | 0 | L1 | L1 |
| 1 | 0 | 1 | 1 | 1 | L1 | L2 |
| 1 | 0 | 1 | 1 | 0 | L1 | L3 |
| 1 | 0 | 1 | 0 | 1 | L1 | L4 |
| 1 | 0 | 1 | 0 | 0 | L1 | L5 |
| 1 | 0 | 0 | 1 | 1 | L2 | L0 |
| 1 | 0 | 0 | 1 | 0 | L2 | L1 |
| 1 | 0 | 0 | 0 | 1 | L2 | L2 |
| 1 | 0 | 0 | 0 | 0 | L2 | L3 |
| 0 | 1 | 1 | 1 | 1 | L2 | L4 |
| 0 | 1 | 1 | 1 | 0 | L2 | L5 |
| 0 | 1 | 1 | 0 | 1 | L3 | L0 |
| 0 | 1 | 1 | 0 | 0 | L3 | L1 |
| 0 | 1 | 0 | 1 | 1 | L3 | L2 |
| 0 | 1 | 0 | 1 | 0 | L3 | L3 |
| 0 | 1 | 0 | 0 | 1 | L3 | L4 |
| 0 | 1 | 0 | 0 | 0 | L3 | L5 |
| 0 | 0 | 1 | 1 | 1 | L4 | L0 |
| 0 | 0 | 1 | 1 | 0 | L4 | L1 |
| 0 | 0 | 1 | 0 | 1 | L4 | L2 |
| 0 | 0 | 1 | 0 | 0 | L4 | L3 |
| 0 | 0 | 0 | 1 | 1 | L4 | L4 |
| 0 | 0 | 0 | 1 | 0 | L4 | L5 |
| 0 | 0 | 0 | 0 | 1 | L5 | L0 |
| 0 | 0 | 0 | 0 | 0 | L5 | L1 |
| x | x | x | x | x | L5 | L2 |
| x | x | x | x | x | L5 | L3 |
| x | x | x | x | x | L5 | L4 |
| x | x | x | x | x | L5 | L5 |

| DATA CONVERSION | | | | | | |
|---|---|---|---|---|---|---|
| | CELL 0 | | | CELL 1 | | |
| | D2 | D1 | D0 | D2 | D1 | D0 |
| L0 | 1 | 1 | 1 | 1 | 1 | 1 |
| L1 | 1 | 1 | 0 | 1 | 1 | 0 |
| L2 | 1 | 0 | 1 | 1 | 0 | 1 |
| L3 | 1 | 0 | 0 | 1 | 0 | 0 |
| L4 | 0 | 1 | 1 | 0 | 1 | 1 |
| L5 | 0 | 1 | 0 | 0 | 1 | 0 |
| L6 | x | x | x | x | x | x |
| L7 | x | x | x | x | x | x |

| USER DATA | | | STATE MAP | | DATA CONVERSION | | | | |
|---|---|---|---|---|---|---|---|---|---|
| | | | | | | CELL 0 | | CELL 1 | |
| B3 | B2 | B1 | CELL 0 | CELL 1 | | D1 | D0 | D1 | D0 |
| 1 | 1 | 1 | L0 | L0 | L0 | 1 | 1 | 1 | 1 |
| 1 | 1 | 0 | L0 | L1 | L1 | 1 | 0 | 1 | 0 |
| 1 | 0 | 0 | L1 | L2 | L2 | 0 | 1 | 0 | 1 |
| 1 | 0 | 1 | L1 | L0 | L3 | x | x | x | x |
| 0 | 1 | 0 | L1 | L1 | | | | | |
| 0 | 1 | 1 | L1 | L2 | | | | | |
| 0 | 0 | 1 | L2 | L0 | | | | | |
| 0 | 0 | 0 | L2 | L1 | | | | | |
| x | x | x | L2 | L2 | | | | | |

330 (State Map), 340 (Data Conversion)

*Fig. 4*

DATA PATH FOR MULTI-LEVEL CELL MEMORY, METHODS FOR STORING AND METHODS FOR UTILIZING A MEMORY ARRAY

TECHNICAL FIELD

Embodiments of the present invention relate generally to semiconductor memory and specifically, in one or more of the illustrated embodiments, to semiconductor memory having a data path for storing more than one binary digit of digital information per memory cell.

BACKGROUND OF THE INVENTION

Each memory cell of a semiconductor memory system, such as a memory device, has traditionally been used to store one binary digit ("bit") of digital information. In order to store large amounts of digital information large arrays of memory cells are used. One challenge that is presented by the traditional approach of one bit per cell is to continually shrink the size of the memory array in order to increase the capacity of the memory without dramatically increasing the overall size of the memory system. Example approaches to reduce the size of the array have been to design memory cells that occupy less area and reducing the distance between the memory cells in order to increase memory cell density and capacity. As the feature size of the memory cells becomes smaller, however, the complexity of fabricating the memory increases resulting in increased cost of manufacturing.

A relatively recent approach to increasing memory capacity has been to design memory cells and supporting circuitry for storing multiple bits of digital information in each memory cell. For example, rather than store one bit of digital information, as has been the tradition, two bits of digital information are stored by a memory cell. Storage of two bits of digital information is accomplished by having memory cells and read/write circuitry that can accurately store, read, and write four distinct memory states. Each of the four memory states represents a different combination of two bits of information, that is, 00, 01, 10, and 11. In contrast, the traditional one bit per cell approach requires memory cells and read/write circuitry that can accurately store, read, and write two distinct memory states, each distinct memory state representing either a 0 or 1. Use of memory cells for storing more than two memory states may be applicable for different types of memory, for example, in both volatile (e.g., DRAM) and non-volatile memory (e.g., flash memory).

Projecting forward along the current trajectory of using memory cells for storing more than two memory states, starting with using two different memory states for storing one bit of digital information and evolving to using four different memory states for storing two bits of digital information, three bits of digital information may be stored by using eight different memory states and four bits of digital information may be stored by using sixteen different memory states. As illustrated by this example, the number of memory states per memory cell is a power-of-two, and the resulting number of bits stored per cell is the base two logarithm of the number of memory states.

A challenge with designing memory systems along this trajectory is the difficulty of reliably and accurately storing, reading, and writing, for example, twice as many memory states as the previous iteration. Evolving from storing, reading and writing two memory states to storing, reading and writing four memory states presented difficulties that were eventually overcome. Evolving from using four memory states to using eight memory states, however, presents challenges that are much more difficult with the current state of technology than those presented in the previous evolution of two memory states to four memory states. Although the difficulties are not insurmountable and will eventually be overcome, it is desirable to have, for example, memory systems utilizing memory cells for storing multiple memory states to provide a storage density of greater than one bit per cell without being limited to storing a power-of-two number of memory states.

BRIEF DESCRIPTION OF THE DRAWINGS

FIG. 3 are truth tables for storing binary user data using pairs of multi-level memory cells having six memory states according to an embodiment of the invention.

FIG. 4 are truth tables for storing binary user data using pairs of multi-level memory cells having three memory states according to an embodiment of the invention.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
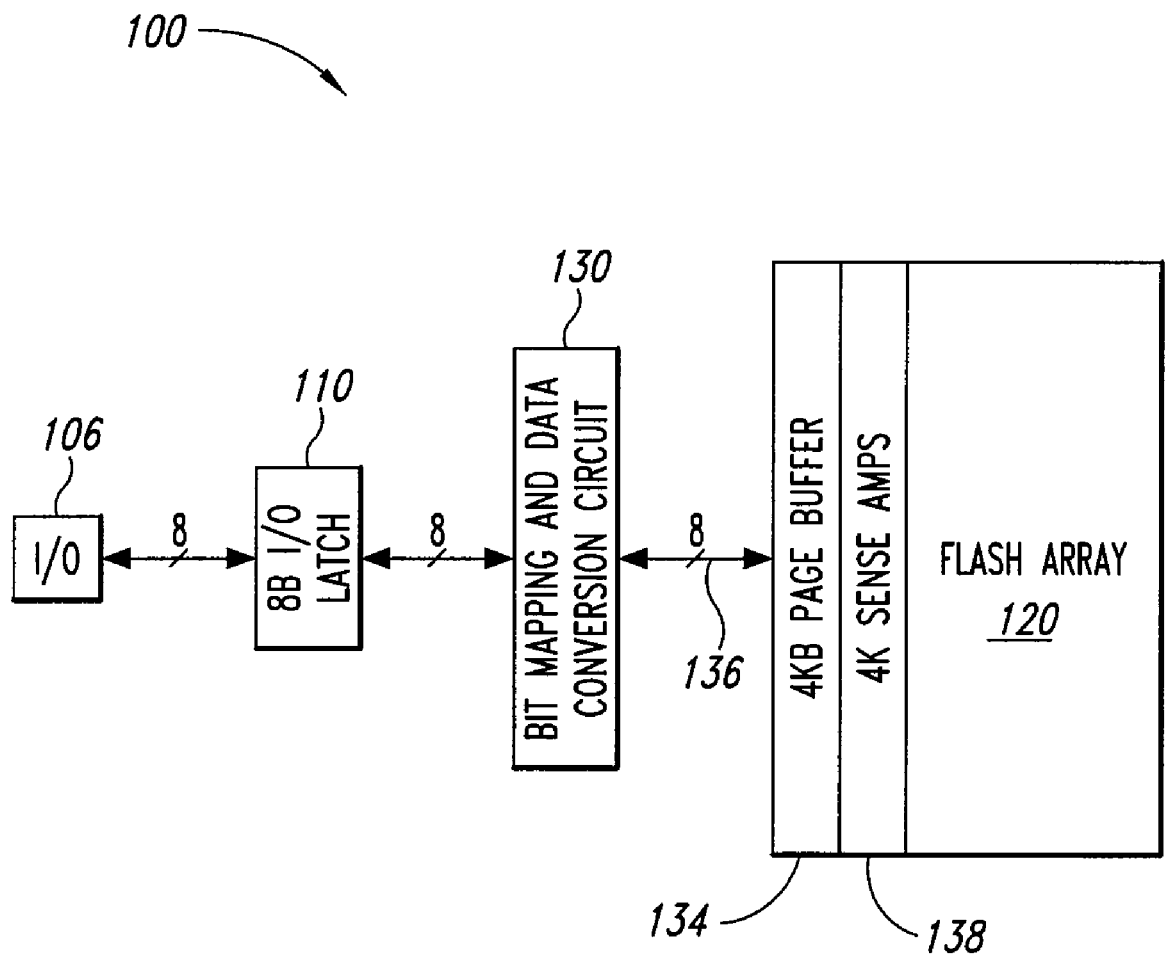
FIG. 1 is a block diagram of a data path according to an embodiment of the present invention.

FIG. 1 illustrates a data path 100 according to an embodiment of the present invention. The data path 100 couples data applied to input/output (I/O) nodes, such as terminals 106 to a flash memory array 120 to write data and couples data from the flash memory array 120 to the I/O terminals 106 to provide read data. The memory array 120 includes multi-level memory cells that store P different memory cell states, where P can be a non-power-of-two number. The data path 100 includes an I/O latch 110 coupled to I/O terminals 106 to latch binary digits (i.e., "bits") of information. In the embodiment illustrated in FIG. 1, the I/O latch 106 is 8-bits wide, and the I/O terminals 106 represent eight I/O terminals. A bit mapping and data conversion circuit 130 according to an embodiment of the present invention is coupled to the latch 110. The bit mapping and data conversion circuit 130, as will be described in more detail below, is configured to enable the memory array 120 to store N bits/cell, where N can be a non-integer number. The bit mapping and data conversion circuit 130 is coupled through a data bus 136 (shown in FIG. 1 as 8-bits wide) to a page buffer 134, which is in turn coupled to sense amplifiers 138 and the flash memory array 120. The data path 100 is similar to a conventional data path, except for including a bit mapping and data conversion circuit coupled between the I/O latch 110 and the buffer 134. In the embodiment illustrated in FIG. 1, the page buffer can store 4 kBits (4,096 bits) and the sense amplifiers 138 include 4 k sense amplifiers. The particular bit-dimensions provided for the data path 100 are provided by way of example, and other embodiments of the invention include components having different bit-dimensions.

Figures 2A, 2B:
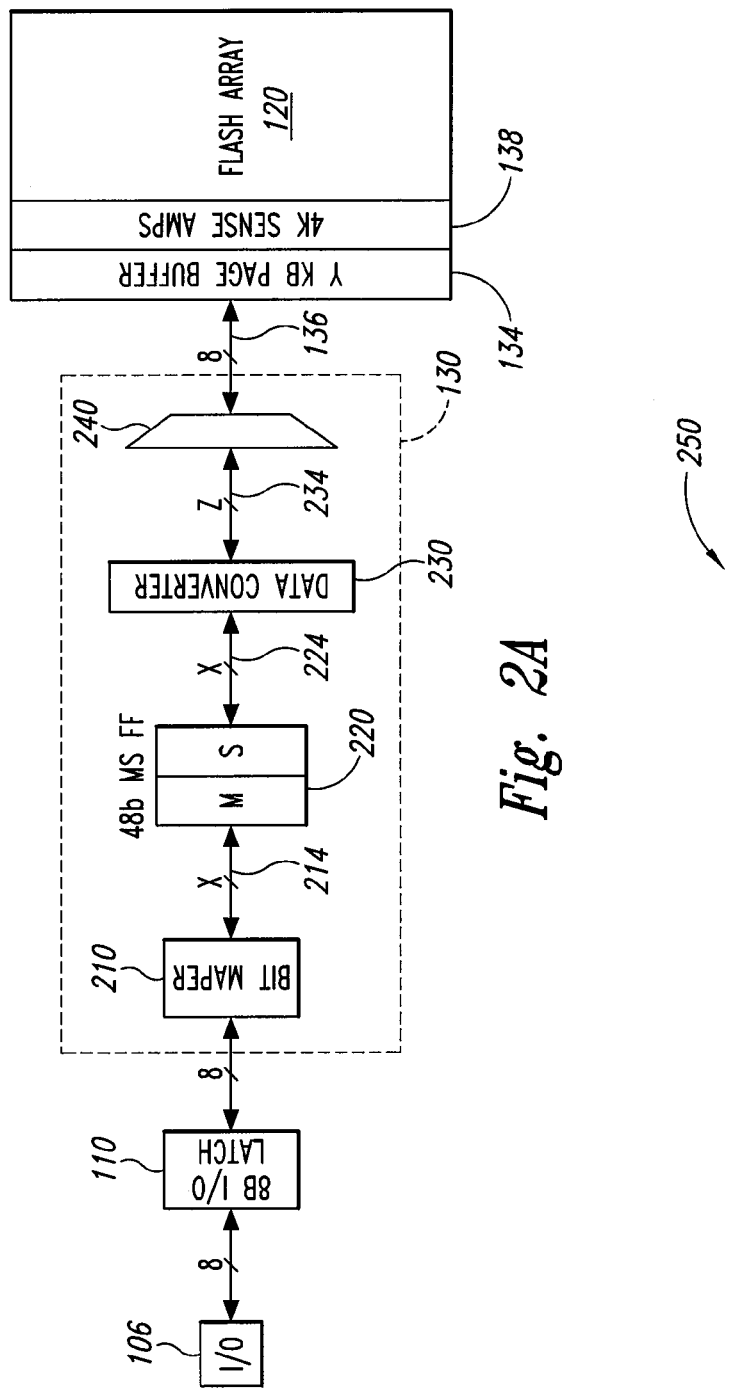
FIG. 2A is a block diagram of a data path having a bit mapping and data conversion circuit 130 according to an embodiment of the present invention.
FIG. 2B is a table of resulting bit/cell storage densities related to using pairs of multi-level memory cells of a memory array having non-power-of-two number of memory states.

FIG. 2A illustrates the data path 100 having a bit mapping and data conversion circuit 130 according to an embodiment of the invention. The bit mapping and data conversion circuit 130 includes a bit mapping circuit 210 coupled through a bus 214 to a register 220 for mapping bits of data from the I/O latch 110 to the register 220, and vice versa. A data converter 230 coupled to the register 220 through bus 224 converts data bits into intermediate binary data (IBD) that is provided over bus 234 to be written to the page buffer 134 through a multiplexer 240. The data converter 230 further converts IBD read from the page buffer 134 into data to be stored in the register 220 to then be provided through the bit mapping circuit 210 to the latch 110. The multiplexer 240 routes the IBD between the bus 234 and the bus 136, which may have different bit-widths. In the embodiment of the invention illustrated in FIG. 2A, the I/O latch is 8-bits wide, and the bus 136 is also 8-bits wide. However, in other embodiments, the bit-widths of the busses can be different.

In operation, the bit mapping and data conversion circuit 130 can be configured to convert binary user data to IBD, and vice versa. The IBD is intermediate binary data that can be stored as a memory cell state in a memory cell of the memory array 120. As previously mentioned, the bit mapping and data conversion circuit 130 can be used to enable binary user data to be stored using groups of multi-level memory cells capable of storing non-power-of-two memory states to effectively store a non-integer number of bits-per-cell. The storage of binary user data using groups of memory cells having non-power-of-two states to provide a non-integer number of bits-per-cell is transparent to a user, who can write and read binary data in conventional byte and word lengths.

Examples of different configurations of the bit mapping and data conversion circuit 130 are shown in table 250 of FIG. 2B, which are provided as non-limiting examples. The example configurations shown in table 250 result from utilizing groups of two memory cells and provide a respective bits-per-cell storage density for the corresponding number of memory states storable by memory cells in the array. For example, assuming groups of two memory cells, the bit mapping and data conversion circuit 130 can be configured to provide a storage density of 2.5 bits/cell when used with memory cells having six storable memory states. In another configuration, the bit mapping and data conversion circuit 130 can provide a storage density of 2 bits/cell when used with memory cells having four storable memory states. As illustrated by the latter example, the bit mapping and data conversion circuit 130 can also be used with memory cells having typical power-of-two storable memory states to provide typical bits-per-cell storage densities.

FIG. 3 illustrates tables 310 and 320 for converting between binary user data and IBD stored by groups of two memory cells, each having six memory states, according to an embodiment of the invention. As previously discussed with reference to FIG. 2 and table 250, in an embodiment utilizing memory cells having six storable memory states (L0-L5) and using a group of two memory cells (Cell0 and Cell1), a storage density of 2.5 bits/cell is achieved. Table 310 illustrates assignment of combinations of the six memory states (L0-L5) of the two memory cells to 5-bit values of binary user data. As will be described in more detail below, a user's 8-bit data (i.e., 1 byte) is divided into 5-bit binary data that is converted into IBD by the data converter 230. The IBD is then stored in a pair of memory cells. Table 320 illustrates the conversion between the IBD and the memory states for the individual cells of the pair.

For example, where the 8-bit binary user data is 01011101 (B7:B0) and is to be written to memory, the user data is split into first 5-bit binary data, with the remaining 3-bits to be part of another 5-bit binary data. In the particular example, the first 5-bit binary data (B4:B0) is 11101 and the remaining 3-bits 010 (B7:B5) will be joined with five other bits from other 8-bit binary user data. Turning to the 5-bit binary data 11101 (B4:B0) and table 310, the binary data corresponds to a combination of memory cell states L0 and L2 stored by a pair of multilevel memory cells Cell0 and Cell1, respectively. As will be described in more detail below, in determining the memory state to be stored by the respective memory cell, the 5-bit binary data is converted into two 3-bit IBDs, which are each in turn stored as a corresponding memory state in a respective memory cell according to table 320.

In reading data from memory, a pair of cells are accessed and the respective memory states are conventionally sensed for memory cells having six memory states to provide corresponding 3-bit IBDs for each memory cell. For example, reading memory cell states L0 and L2 stored by memory cells Cell0 and Cell1, respectively, the two memory cells are accessed and memory states L0 and L2 result in two 3-bit IBDs of 111 and 101. The 3-bit IBDs are converted back into 5-bit binary data. According to table 310, the resulting 5-bit data is 11101, which is the original 5-bit binary data from the previous example of writing data to memory. The 5-bit binary data is then concatenated to other 5-bit binary data read from the memory and split into the original 8-bit binary user data.

FIG. 4 illustrates tables 330 and 340 for converting between binary user data and IBDs stored by groups of two memory cells, each having three memory states, according to an embodiment of the invention. As previously discussed with reference to FIG. 2 and table 250, in an embodiment utilizing memory cells having three storable memory states (L0-L2) and using a group of two memory cells (Cell0 and Cell1), a storage density of 1.5 bits/cell is achieved. Table 330 illustrates assignment of combinations of the three memory states (L0-L2) of the two memory cells to 3-bit values of binary user data. As will be described in more detail below, a user's 8-bit data is divided into 3-bit binary data that is converted into IBD by the data converter 230. The IBD is then stored in a pair of memory cells. Table 340 illustrates the conversion between the IBD and the memory states for the individual cells of the pair.

For example, where the 8-bit binary user data is 01011101 (B7:B0) and is to be written to memory, the user data is split into first and second 3-bit binary data (B2:B0) and (B5:B3), with the remaining 2-bits (B7:B6) to be part of another 3-bit binary data. In the particular example, the first 3-bit binary data is 101, the second 3-bit binary data is 011, and the remaining 2-bits 01 will be joined with one other bit from other 8-bit binary user data. Turning to the two 3-bit binary data 101 and 011, and table 330, the first binary data 101 corresponds to a combination of memory cell states L1 and L0 stored by a first pair of multilevel memory cells Cell0 and Cell1, respectively. The second binary data 011 corresponds to a combination of memory cell states L1 and L2 stored by a second pair of multilevel memory cells Cell0 and Cell1, respectively. As will be described in more detail below, in determining the memory state to be stored by the respective memory cell, the 3-bit binary data is converted into two 2-bit IBDs, which are each in turn stored as a corresponding memory state in a respective memory cell.

In reading data from memory, a pair of cells are accessed and the respective memory states are conventionally sensed for memory cells having three memory states to provide corresponding 2-bit IBDs for each memory cell. For example, taking memory cell states L1 and L0 stored by the first pair of memory cells Cell0 and Cell1, respectively, the two memory cells are accessed and memory states L1 and L0 result in two IBDs of 10 and 11. Memory cell states L1 and L2 stored by a second pair of multilevel memory cells Cell0 and Cell1, respectively, the two memory cells are accessed and memory states L1 and L2 result in two IBDs of 10 and 01. The 2-bit IBDs are converted back into 3-bit binary data. In the present example, the resulting 3-bit binary data for the first pair of memory cells is 101 and the resulting 3-bit binary data for the second pair of memory cells is 011, in accordance with table 330, which are the original 3-bit data from the previous example of writing data to memory. The 3-bit binary data is then concatenated to other 3-bit binary data read from the memory and split into the original 8-bit binary user data.

Figure 5:
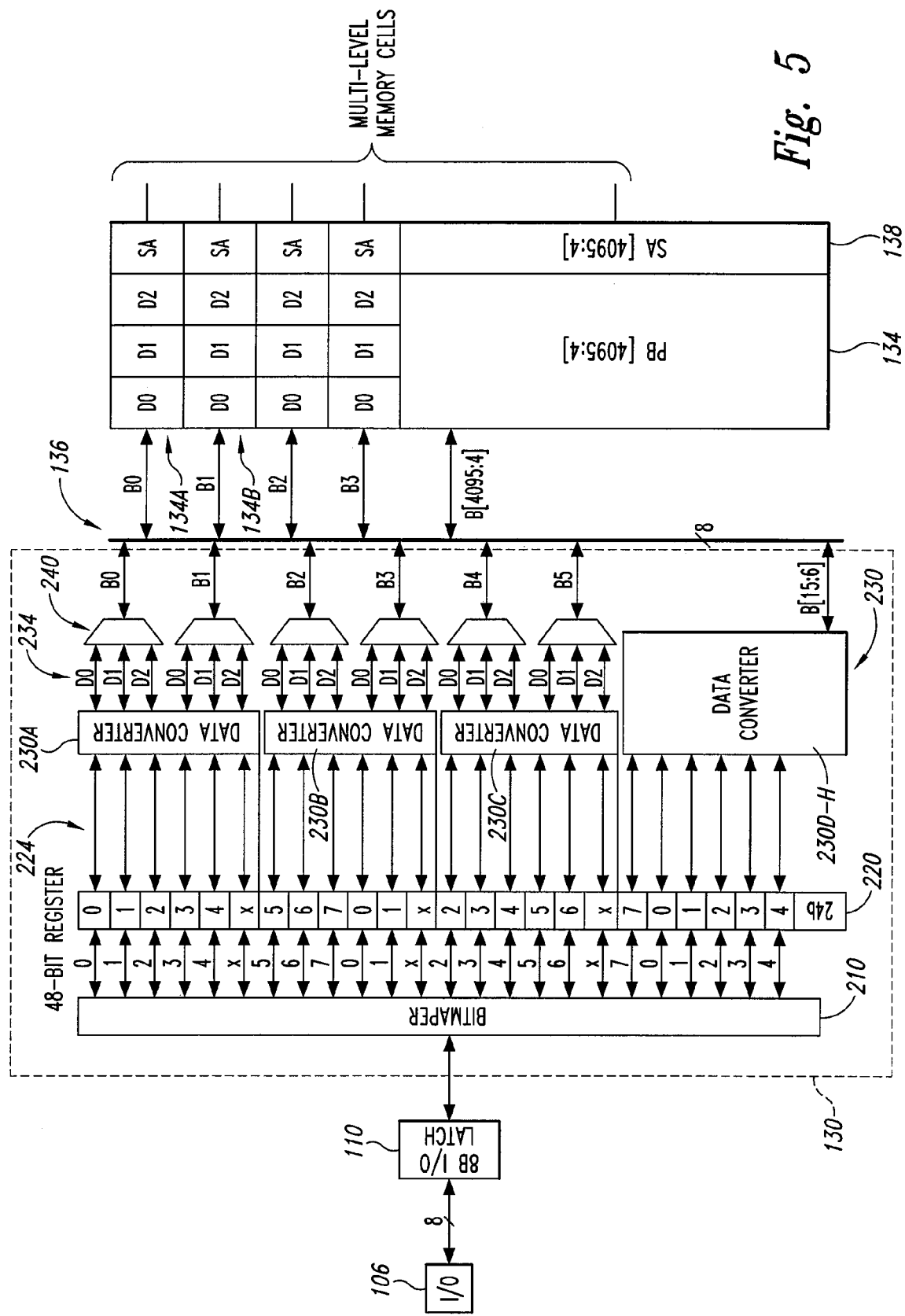
FIG. 5 is a block diagram of a data path according to an embodiment of the present invention for storing data using pairs of multi-level memory cells having six memory states.

FIG. 5 illustrates the data path 100 having a bit mapping and data conversion circuit 130 according to an embodiment of the present invention. The data path 100 of FIG. 5 can be used to implement the six memory state, two cell example previously discussed with reference to FIG. 3. The embodiment of the invention shown in FIG. 5 includes an 8-bit input/output latch coupled through a bit mapping circuit 210 to a 48-bit register 220. The 48-bit register 220 provides binary data to eight data converter subcircuits 230A-H that convert the binary user data into IBDs, which are written to a multi-level memory cell array through multiplexers 240, data bus 136 and a buffer 134. Sense amplifiers 138 convert between memory states stored by the multi-level memory cells and IBDs stored in the page buffer 134.

In operation, 8-bit user data loaded in the latch 110 is sequentially provided to the bit mapping circuit 210 to have the bits of the user data mapped to corresponding locations of the register 220. In the embodiment shown in FIG. 5, the 8-bit user data is mapped through the bit mapping circuit 210 until the appropriate number of bits of user data are loaded into the register 220. In the present example of six memory states and two cells, the 8-bit user data is split into 5-bit binary data, as previously discussed. The 5-bit binary data stored in the register 220 are provided to data converter subcircuits 230A-H to be converted into pairs of 3-bit IBDs, which are in turn converted into memory states stored in respective memory cells.

For example, using the previously described example with reference to FIG. 3, 8-bit binary user data 01011101 (B7:B0) is loaded into the latch 110 to be mapped through bit mapping circuit 210 into register 220. In the embodiment shown in FIG. 5, bits 11101 (B4:B0) would be mapped to five of six bit register locations of the register 220 that are coupled to data converter subcircuit 230A and bits 010 (B7:B5) would be mapped to three of six bit register locations of the register 220 that are coupled to data converter subcircuit 230B. 8-bit binary user data continues to be loaded through the bit mapping circuit 210 until the register 220 is loaded. In the example of splitting the 8-bit user data into 5-bit binary data, five 8-bit bytes of user data can be loaded in the 48-bit register 220 until the its capacity is reached. The data converter subcircuits 230A-H convert the 5-bit binary data into 3-bit IBDs, as previously discussed. With reference to table 310 of FIG. 3, the 5-bit data 11101 of the particular example is converted by data converter subcircuit 230A into 3-bit IBDs 111 and 101, which are provided over bus 234 to be loaded bit-by-bit through multiplexer 240 and data bus 136 to locations 134A and 134B in the page buffer 134. The other 5-bit binary data stored in the register 220 are similarly converted into respective pairs of 3-bit IBDs by the data converter subcircuits 230B-H and loaded through the bus 234, mutliplexer 240, and data bus 136 into the page buffer 134.

After the page buffer 134 is loaded with the IBDs, sense amplifiers 138 convert the respective 3-bit IBD into a corresponding memory state to be stored in a respective multi-level memory cell. Sense amplifiers for converting the IBDs into a corresponding memory state is known in the art, and sense amplifiers of conventional design can be used for the sense amplifiers 138. In the present example, the 3-bit IBD 111 corresponds to memory state L0 (with reference to table 320 of FIG. 3) and is stored in a first memory cell Cell0 of a pair of memory cells Cell0, Cell1 (not shown) used to store the 5-bit binary data. The 3-bit IBD 101 corresponds to L2 and is stored in a second memory cell Cell1.

When reading data from the multi-level memory cells, the process of writing data to the multi-level memory cells is generally reversed. That is, the memory states stored by multi-level memory cells are sensed by sense amplifiers 138 and converted into 3-bit IBDs that are stored in respective locations in the page buffer 134. The IBDs from pairs of memory cells are coupled to the respective data converter subcircuit, for example, IBDs stored by locations 134A, 134B are coupled through the data bus 136, multiplexers 240 and bus 234 to the data converter subcircuit 230A. The two 3-bit IBDs are converted by the data converters 230 into corresponding 5-bit binary data that is stored in appropriate bit locations in register 220. The bit mapping circuit 210 maps the 5-bit binary data into 8-bit data to reconstruct the original 8-bit binary user data.

Figure 6:
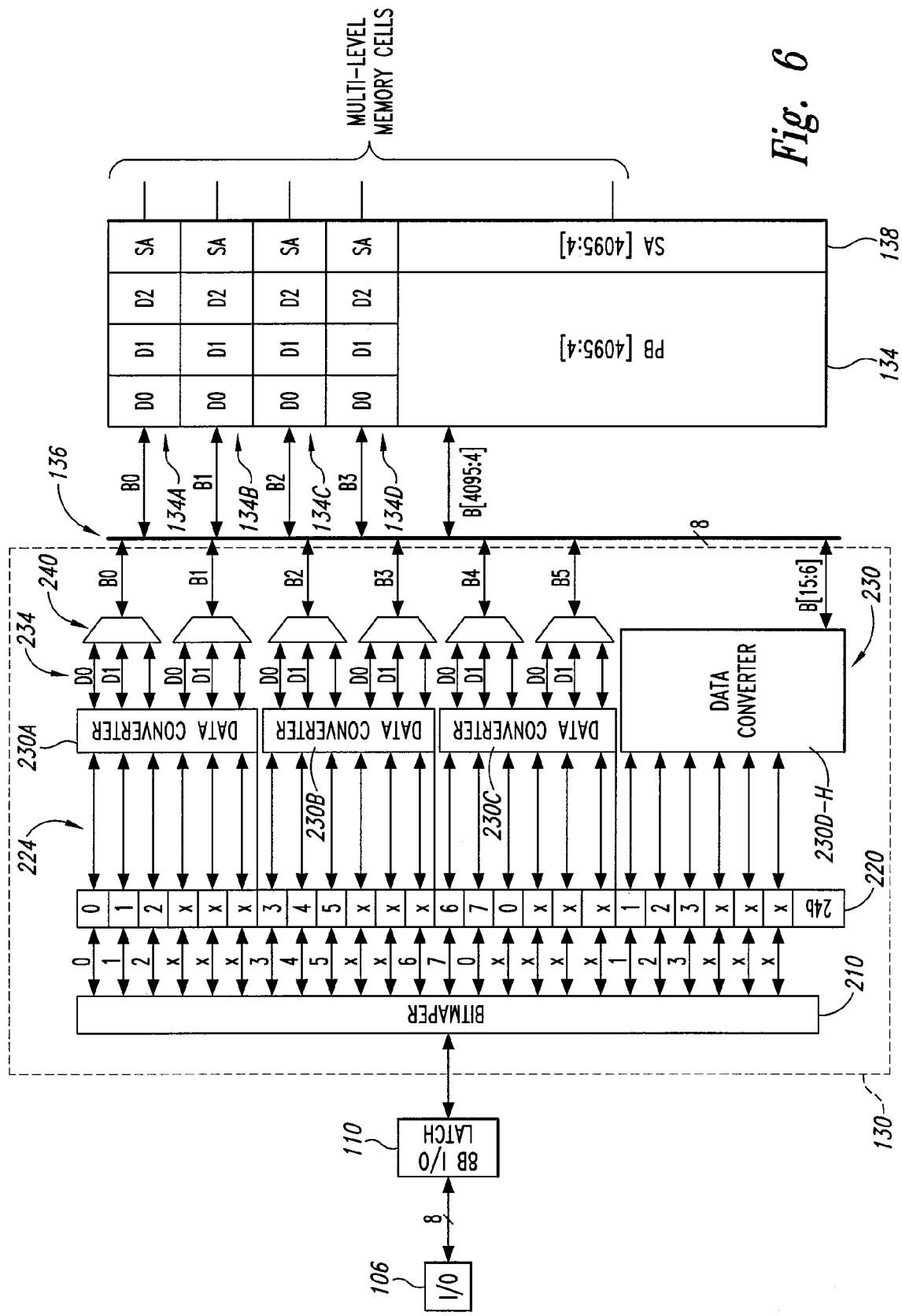
FIG. 6 is a block diagram of a data path according to another embodiment of the present invention for storing data using pairs of multi-level memory cells having three memory states.

FIG. 6 illustrates the data path 100 previously described with reference to FIG. 5 having the bit mapping and data conversion circuit 130 configured implement the three memory state, two cell example previously discussed with reference to FIG. 4. That is, in some embodiments of the invention, the data path 100 can be configured to implement different bit/cell storage densities in a memory having multi-level memory cells, including multi-level memory cells capable of storing non-power-of-two memory states and bit/cell storage densities that are non-integer numbers.

In operation, 8-bit binary user data loaded in the latch 110 is sequentially provided to the bit mapping circuit 210 to have the bits of the user data mapped to corresponding locations of the register 220. In the embodiment shown in FIG. 6, the 8-bit user data is mapped through the bit mapping circuit 210 into 3-bit binary data, as previously discussed with reference to FIG. 4, which are stored in the register 220. The 3-bit binary data stored in the register 220 are provided to data converter subcircuits 230A-H to be converted into pairs of 2-bit IBDs, which are in turn converted into memory states stored in respective memory cells.

For example, using the previously described example with reference to FIG. 4, 8-bit binary user data 01011101 (B7:B0) is loaded into the latch 110 to be mapped through bit mapping circuit 210 into register 220. In the embodiment shown in FIG. 6, bits 101 (first 3-bits B2:B0) are mapped to three of six bit register locations coupled to data converter subcircuit 230A and bits 011 (second 3-bits B5:B3) are mapped to three of six bit register locations coupled to data converter subcircuit 230B. The remaining bits 01 (B7:B6) are mapped to two of six bits register locations coupled to data converter subcircuit 230C, which will be concatenated to 1-bit of the next 8-bit user data loaded into the latch 110. 8-bit binary user data continues to be loaded through the bit mapping circuit 210 until the register 220 is loaded. In the example of splitting the 8-bit user data into 3-bit binary data, three 8-bit bytes of user data can be loaded in the 48-bit register 220 until the its capacity is reached. The data converter subcircuits 230A-H convert the 3-bit binary data into 2-bit IBDs, as previously discussed with reference to table 340 of FIG. 4. The first 3-bit data 101 is converted by data converter subcircuit 230A into 2-bit IBDs 10 and 11, which are provided over bus 234 to be loaded bit-by-bit through multiplexer 240 and data bus 136 to locations 134A and 134B in the page buffer 134. The second 3-bit data 011 is converted by data converter subcircuit 230B into 2-bit IBDs 10 and 01, which are provided over bus 234 to be loaded bit-by-bit through multiplexer 240 and data bus 136 to locations 134C and 134D in the page buffer 134.

When reading data from the multi-level memory cells, the memory states stored by multi-level memory cells are sensed by sense amplifiers 138 and converted into 2-bit IBDs that are stored in respective locations in the page buffer 134. The IBDs from pairs of memory cells are coupled to the respective data converter subcircuit, for example, IBDs stored by locations 134A, 134B and IBDs stored by locations 134C, 134D are coupled through the data bus 136, multiplexers 240 and bus 234 to the data converter subcircuit 230A and 230B, respectively. The pairs of 2-bit IBDs are converted into corresponding 3-bit binary data, which are stored in appropriate bit locations in register 220. The bit mapping circuit 210 maps the 3-bit binary data into 8-bit data to reconstruct the original 8-bit user data.

Figure 7:
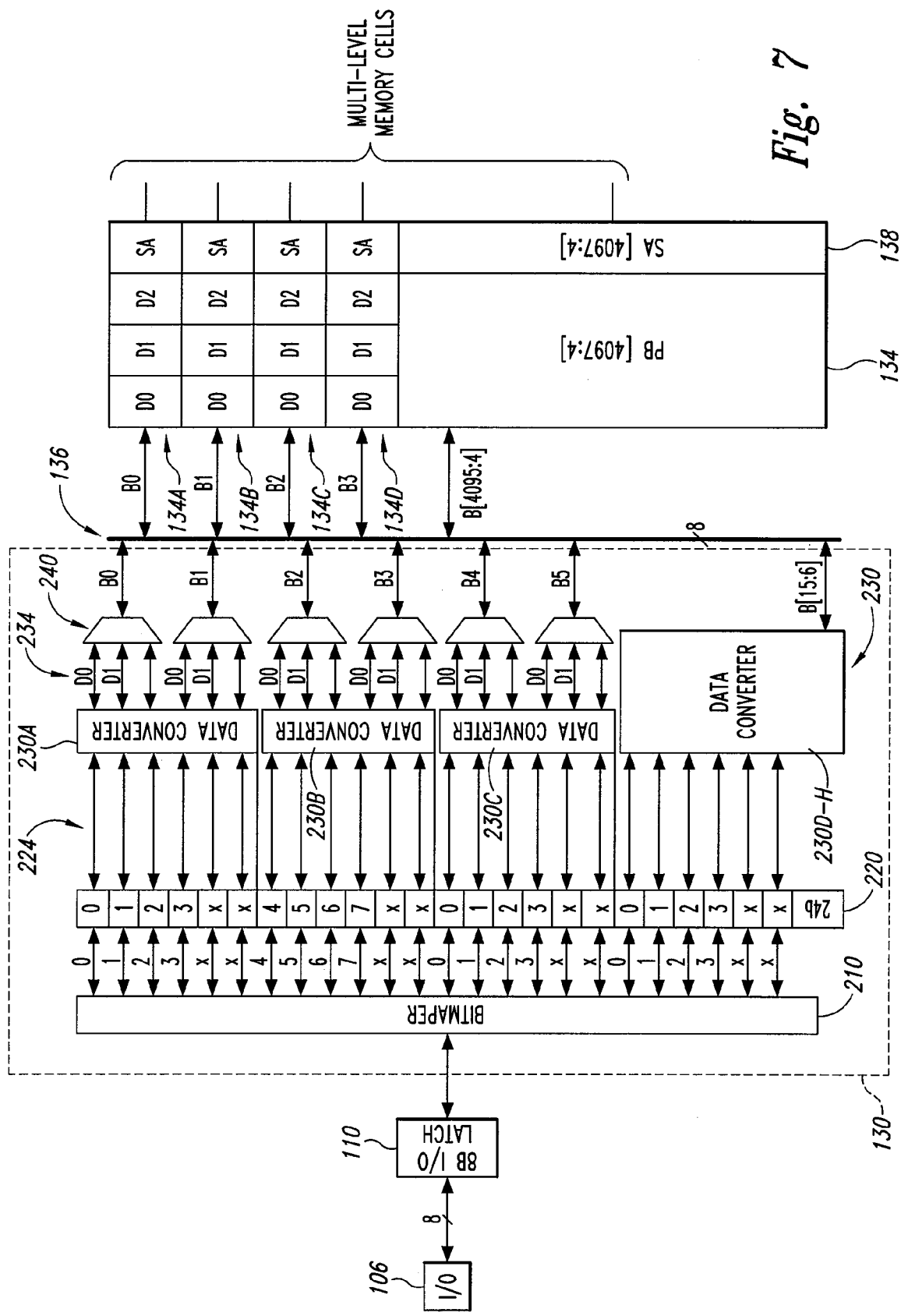
FIG. 7 is a block diagram of a data path according to another embodiment of the present invention for storing data using pairs of multi-level memory cells having four memory states.

FIG. 7 illustrates the data path 100 previously described with reference to FIG. 5 having the bit mapping and data conversion circuit 130 configured implement a four memory state, two cell example to provide a bit/cell storage density of 2 bits/cell. As previously described with reference to FIGS. 5 and 6, the data 100 can be used for memories having multi-level memory cells capable of storing non-power-of-two memory states to provide bit/cell storage densities that are non-integer numbers. As shown in the embodiment of FIG. 7, the data conversion circuit 130 can also be configured to work with multi-level memory cells capable of storing power-of-two memory states to provide an integer number of bit/cell storage density. Operation of the embodiment illustrated in FIG. 7 is similar to that previously described with reference to FIGS. 5 and 6. In summary, the 8-bit user data is split into 4-bit binary data mapped to four of six bit register locations coupled to a respective data converter subcircuit 230. The 4-bit binary data is converted by the respective data converter subcircuit into two 2-bit IBDs. Each of the 2-bit IBDs are provided to the page buffer 134 and converted by the sense amplifiers 138 into a corresponding memory state to be stored in the memory array. Reading data is essentially the reverse of writing data to the memory array.

A truth table for the mapping of binary user data and conversion to IBDs, and then to corresponding memory states for the four memory state, two memory cell example of FIG. 7, has not been provided herein, in the interest of brevity because such truth tables can be conventional. For example, each of the four memory states can correspond to a different 2-bit IBD (00, 01, 10, 11). Using a pair of memory cells, each memory cell having four memory states, sixteen different 4-bit combinations can be made. Each of the different 16-bit combinations can be represented by a different combination two 2-bit IBDs. As previously discussed, the resulting storage density is 2 bits/cell.

One or more Embodiments of the present invention can also have a bit mapping and data conversion circuit 130 configurable for use with different combinations of memory states to provide different bit/cell storage densities. In one embodiment, configuration of such a bit mapping and data conversion circuit can be reconfigured by user. For example, with reference to FIGS. 2A and 2B, given an N bits/cell storage density, a user can select N on a block boundary of the memory array, and configures the bit-widths of the bus 214 coupled between the bit mapping circuit 210 and the register 220, bus 224 coupled between the register 220 and the data converter 230, and bus 234 coupled between the data converter 230 and the multiplexer 240 to provide the desired N bits/cell. In still other embodiments of the invention, the bit mapping and data conversion circuit does not need to be configurable.

The specific embodiments previously described have been provided by way of example, and is not intended to limit the scope of the present invention. Modifications can be made to the previous embodiment and remain within the scope of the present invention. For example, in other embodiments of the invention, the bit mapping and data conversion circuit 130 can include registers having greater or lesser bit capacity that than described with reference to FIG. 5. Additionally, the coupling of data converters to bit register locations and the bit-widths of the buses may be different in other embodiments as well. Therefore, those ordinarily skilled in the art will understand the previously described embodiments are not intended to limit the scope of the present invention.

Figure 8:
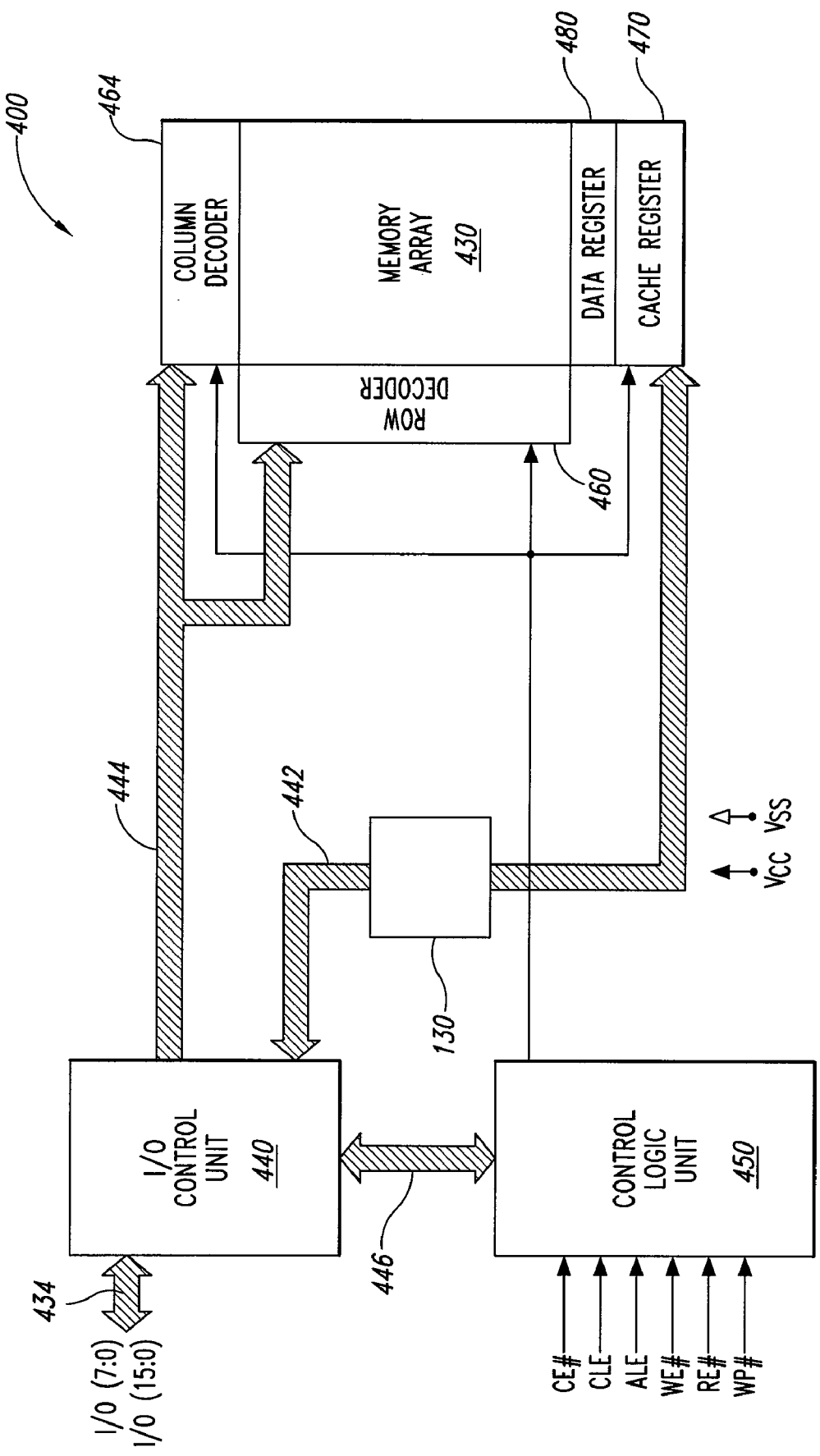
FIG. 8 is a block diagram of a memory system having a data path according to an embodiment of the present invention.

FIG. 8 illustrates a memory system 400 that includes a data path according an embodiment of the invention. The memory system 400 includes an array 430 of memory cells arranged in banks of rows and columns. In one embodiment, the memory cells of the array 430 are non-volatile memory. In some embodiments, the non-volatile memory cells are capable of storing multiple memory states, including non-volatile memory cells capable of storing a non-power-of-two number of memory states.

Most command signals, the address signals and the write data signals are applied to the memory system 400 as sets of sequential input/output ("I/O") signals transmitted through an I/O bus 434. The I/O bus 134 illustrated in FIG. 8 may include I/O terminals 106 and I/O latch 110 (not shown in FIG. 8). Similarly, read data signals are output from the memory system 400 through the I/O bus 434. The I/O bus is connected to an I/O control unit 440 that routes the signals between the I/O bus 434 and an internal data bus 442, an internal address bus 444, and an internal command bus 446. The internal data bus 442 may include a data path according to an embodiment of the present invention. A bit mapping and data conversion circuit 130 according to an embodiment of the present invention is coupled to the internal data bus 442. As previously discussed, the bit mapping and data conversion circuit 130 may be used to read and write data in multi-level memory cells storing a non-power-of-two number of memory states. The memory system 400 also includes a control logic unit 450 that receives a number of control signals either externally or through the command bus 446 to control the operation of the memory system 400. The address bus 444 applies row address signals to a row decoder 460 and column address signals to a column decoder 464. Similarly, the column decoder 464 enables write data signals to be applied to bit lines for columns corresponding to the column address signals and allow read data signals to be coupled from bit lines for columns corresponding to the column address signals.

In response to the memory commands decoded by the control logic unit 450, the memory cells in the array 430 are erased, programmed, or read. The memory array 430 is programmed on a row-by-row or page-by-page basis. After the row address signals have been applied to the address bus 444, the I/O control unit 440 routes write data through the bit mapping and data conversion circuit 130 to a cache register 470. The intermediate binary data are stored in the cache register 470 in preparation for programming. The cache register 470 sequentially stores the sets of intermediate binary data for an entire row or page of memory cells in the array 430. A page buffer (not shown), as previously described, may be included in or represented by the cache register 470 illustrated in FIG. 8. Sense amplifiers previously discussed are not shown in FIG. 8, although those ordinarily skilled in the art understand the memory system 400 includes sense amplifiers coupled to the memory cells of the array 430. All of the stored intermediate binary data are then used to program a row or page of memory cells in the array 430 selected by the row address coupled through the address bus 444. In a similar manner, during a read operation, intermediate binary data from a row or page of memory cells selected by the row address coupled through the address bus 444 are stored in a data register 480. Sets of the intermediate binary data are then transferred to the bit mapping and data conversion circuit 130 to provide read data to the I/O control unit 440 and then to the I/O bus 434.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory, comprising:
   an array of memory cells, each of the cells configured to store a plurality of memory states; and
   a bit conversion circuit coupled to the array of memory cells, the bit conversion circuit configured to divide bits of original data into sub-groups of bits and further configured to convert the sub-groups of bits into intermediate data corresponding to a respective memory state, the intermediate data stored in the array of memory cells.

2. The memory of claim 1 wherein the array of memory cells comprises an array of non-volatile memory cells.

3. The memory of claim 2 wherein the array of non-volatile memory cells comprises an array of non-volatile memory cells, each memory cell configured to store a non-power-of-two number of memory states.

4. The memory of claim 1 wherein the bit conversion circuit is configured to be operable with memory cells of different numbers of memory states.

5. The memory of claim 4 wherein the bit conversion circuit is user configurable for operation with memory cells of different numbers of memory states.

6. The memory of claim 1 wherein the bit conversion circuit is configured to convert bits of the original data into bits of the intermediate data.

7. The memory of claim 1, further comprising sense circuitry coupled to the array of memory cells, the sense circuitry configured to sense a memory state stored by a memory cell and generate corresponding intermediate data.

8. The memory of claim 1, further comprising a buffer circuit coupled to the bit conversion circuit and further coupled to the array of memory cells, the buffer circuit configured to store the intermediate data.

9. The memory of claim 1, further comprising:
   input/output (I/O) nodes; and
   I/O latches coupled to the I/O nodes and the bit conversion circuit, the I/O latches configured to latch data from and to the I/O nodes.

10. A data path for a memory having an array of memory cells, the data path comprising:
    a bit mapping circuit configured to map bits of the original data to an intermediate arrangement of bits;
    a data converter circuit coupled to the bit mapping circuit and configured to receive the intermediate arrangement of bits and convert the intermediate arrangement of bits into intermediate data corresponding to a memory state to be stored by memory cells of the array; and
    a multiplexer coupled to the data converter circuit and configured to selectively couple the intermediate data to the array of memory cells.

11. The data path of claim 10, further comprising a register coupled to the bit mapping circuit and configured to store the intermediate arrangement of bits and provide the same to the data converter circuit.

12. The data path of claim 10 wherein the bit mapping circuit is configured to map bits of the original data to sub-groups of bits, the sub-groups having fewer bits than a byte of the original data.

13. The data path of claim 12 wherein the data converter circuit comprises a plurality of data converter subcircuits, each of the data converter subcircuits coupled to receive the bits of a respective sub-group of bits.

14. The data path of claim 10 wherein the data converter circuit is further configured to convert each of the intermediate arrangement of bits into intermediate data corresponding to a plurality of memory states to be stored by a respective one of a plurality of memory cells.

15. The data path of claim 10 wherein the bit mapping and data converter circuits are configurable to be operable with different combinations of memory states.

16. The data path of claim 15 wherein the bit mapping and data converter circuits are user configurable to be operable with different combinations of memory states.

17. The data path of claim 10, further comprising
    input/output (I/O) nodes; and
    I/O latches coupled to the I/O nodes and the bit mapping circuit, the I/O latches configured to latch data from and to the I/O nodes.

18. A method for storing data in memory cells of a memory array, the method comprising:
    dividing original data into at least one sub-group of bits;
    converting the sub-group of bits into corresponding intermediate data; and
    storing a memory state in a memory cell corresponding to the intermediate data.

19. The method of claim 18 wherein converting the sub-group of bits into corresponding intermediate data comprises converting the sub-group of bits into a plurality of intermediate data and wherein storing a memory state in a memory cell corresponding to the intermediate data comprises storing in a respective plurality of memory cells a memory state corresponding to the respective intermediate data.

20. The method of claim 18 wherein dividing the original data into at least one sub-group of bits comprises mapping bits of the original data to bits of the sub-group to provide an intermediate arrangement of bits.

21. The method of claim 18 wherein storing a memory state in a memory cell comprises storing one of a non-power-of-two number of memory states in the memory cell, each memory state corresponding to different intermediate data.

22. The method of claim 18, further comprising reading data from the memory cells of the memory array, the data read by
- sensing memory states stored by memory cells and determining a respective corresponding intermediate data therefrom;
- converting the intermediate data into a corresponding sub-groups of bits;
- mapping the sub-groups of bits to original data; and
- providing the original data as read data.

23. The method of claim 18, further comprising receiving original data to be stored in the memory array.

24. A method for utilizing an array of memory cells storing a non-power-of-two number of memory states, the method comprising:
- when writing original data to the array of memory cells, mapping bits of the original data to groups of bits, converting groups of bits of the original data into corresponding intermediate data and storing a memory state in at least one memory cell corresponding to the intermediate data; and
- when reading the original data from the array of memory cells, sensing the memory state stored in the at least one memory cell to and generating the intermediate data, converting the intermediate data to the corresponding groups of bits, and mapping the groups of bits to bits of the original data.

25. The method of claim 24 wherein converting groups of bits of the original data into corresponding intermediate data comprises converting each group of bits of the original data into a plurality of intermediate data and wherein storing a memory state in at least one memory cell corresponding to the intermediate data comprises storing each of the plurality of intermediate data of each group as a corresponding memory state in a respective memory cell.

26. The method of claim 24 wherein sensing the memory state stored in the at least one memory cell comprises sensing the memory states stored in a plurality of memory cells and wherein converting the intermediate data to the corresponding groups of bits comprises converting a plurality of intermediate data for each group of bits.

27. The method of claim 24 wherein mapping bits of the original data to groups of bits comprises splitting a plurality of original data into a plurality of sub-groups of bits, each sub-group having fewer bits than a byte of the original data.

28. The method of claim 24 wherein mapping the groups of bits to bits of the original data comprises concatenating a plurality of the groups of bits and splitting the concatenated bits into words having the same number of bits as the original data.

29. A data path for a memory having an array of memory cells, the data path comprising:
- a bit mapping circuit configured to map bits of the original data to an intermediate arrangement of bits; and
- a data converter circuit coupled to the bit mapping circuit and configured to receive the intermediate arrangement of bits and convert each of the intermediate arrangement of bits into intermediate data corresponding to a plurality of memory states to be stored by a respective one of a plurality of memory cells.

* * * * *